United States Patent [19]
Savary et al.

[11] Patent Number: 6,005,383
[45] Date of Patent: Dec. 21, 1999

[54] ELECTRICAL CURRENT SENSOR WITH MAGNETIC FIELD DETECTOR

[75] Inventors: Pierre Savary; Marc Laforet, both of Osaka, Japan

[73] Assignee: Liasons Electroniques-Mecaniques LEM S.A., Plan-les-Ouates, Switzerland

[21] Appl. No.: 08/913,732
[22] PCT Filed: Mar. 25, 1996
[86] PCT No.: PCT/CH96/00109
§ 371 Date: Dec. 29, 1997
§ 102(e) Date: Dec. 29, 1997
[87] PCT Pub. No.: WO96/30773
PCT Pub. Date: Oct. 3, 1996

[30] Foreign Application Priority Data
Mar. 24, 1995 [JP] Japan ................................ 7-091510

[51] Int. Cl.$^6$ ............... G01R 33/00; G01R 15/20; G01R 19/00; H05K 1/18
[52] U.S. Cl. ............ 324/117 H; 324/127; 361/761
[58] Field of Search ................... 324/117 H, 127, 324/117 R; 336/65, 66, 67, 199, 200, 205, 206; 361/760, 761

[56] References Cited

U.S. PATENT DOCUMENTS 5,552,700   9/1996   Tanabe et al. ..................... 324/117 H

*Primary Examiner*—Walter E. Snow
*Attorney, Agent, or Firm*—Clifford W. Browning; Woodard, Emhardt, Naughton, Moriarty & McNett

[57] ABSTRACT

The invention concerns an electrical current sensor comprising a magnetic circuit (3), with an air gap (3a), a winding (4) on the magnetic circuit in which a current to be measured flows, a magnetic field detector (5) arranged in the air gap, and a support plate (2) carrying an electrical circuit (6) configured to amplify an output signal from the magnetic field detector. The support plate (2) comprises a main part (21) and a lateral extension (23), the entire unit having an area cut away from the overall rectangular shape of the plate. The turns (4a) of the winding (4) are arranged at that area in such a way that the thickness of the sensor depends on the transverse dimensions of the winding.

11 Claims, 3 Drawing Sheets

ELECTRICAL CURRENT SENSOR WITH MAGNETIC FIELD DETECTOR

The present invention relates to a current sensor comprising a magnetic circuit with an air-gap, a winding arranged on this magnetic circuit in which flows an electric current to be measured, a magnetic field detecteur arranged in said air-gap and a support plate bearing an electric circuit arranged for amplifying an output signal of said magnetic field detector.

Current sensors of this type are well known and are being used in many technical applications. However, they do not meet all requirements from the standpoint of bulk and cost price.

The present invention therefore aims more particularly at reducing the bulk of such a sensor as well as the space it will occupy when mounted on an external circuit, and it particularly has for object to provide a sensor of substantially flat shape. Furthermore, the invention has for object to provide a sensor of reduced dimensions in which there exists nevertheless a very weak influence of the circuit in which flows the current to be measured on the measuring circuit, and which also has a good immunity against external electromagnetic fields. An important aim of the invention is further to make possible the manufacture of such a sensor in great series in a very economic and efficient way.

To achieve this, the sensor according to the invention is characterized in that said support plate comprises a main portion and a lateral extension thereof, so that the plate has a cut-away area defined by respective adjacent sides of said main portion and of said extension, the magnetic field detector being mounted on the support plate and the magnetic circuit being fixed to this plate in such a way that the magnetic field detector is placed in the air-gap of the magnetic circuit and the winding is placed, at least partially, in said cut-away area.

According to one embodiment of the sensor, the support plate comprises at least one metallized shielding area connected to the ground potential of the electric circuit, this area having at least one portion extending between the magnetic field detector and said winding. This shielding area can have a portion extending between the support plate and a part of the magnetic circuit. Preferably, such a metallized shielding area is provided on either side of the support plate.

According to a preferred embodiment, the winding is arranged on a substantially rectilinear leg of the magnetic circuit, the air-gap being formed between a lateral surface portion of a free end of this rectilinear leg and a free end of a leg of the magnetic circuit perpendicular to said rectilinear leg.

To make possible the use of a pre-formed winding and the mounting of such a winding on said rectilinear leg of the magnetic circuit, the thickness of the winding in the transversal direction thereof is smaller than the length of the air-gap of the magnetic circuit. Preferably, the winding has a cross-section such that it will be fitted closely around the leg of the magnetic circuit on which it is arranged, if necessary over an electrically insulating tube.

The magnetic circuit is preferably made in the form of a stack of metal sheets, said insulating tube being arranged so as to maintain together the portions of the various sheets forming the leg on which it is arranged, and a portion of the magnetic circuit is mechanically fixed to the support plate so as to maintain together the sheets of the circuit by means of this fixing. The insulating tube can advantageously be made of a heat-shrinkable material.

By these different means, the invention makes it possible to manufacture a current sensor achieving the above mentioned objectives in an optimal way.

The invention will be better understood in the light of the detailed description of an example of embodiment shown in the attached drawing, in which FIG. 1 is a side view of a current sensor according to the invention;

Figure 1:
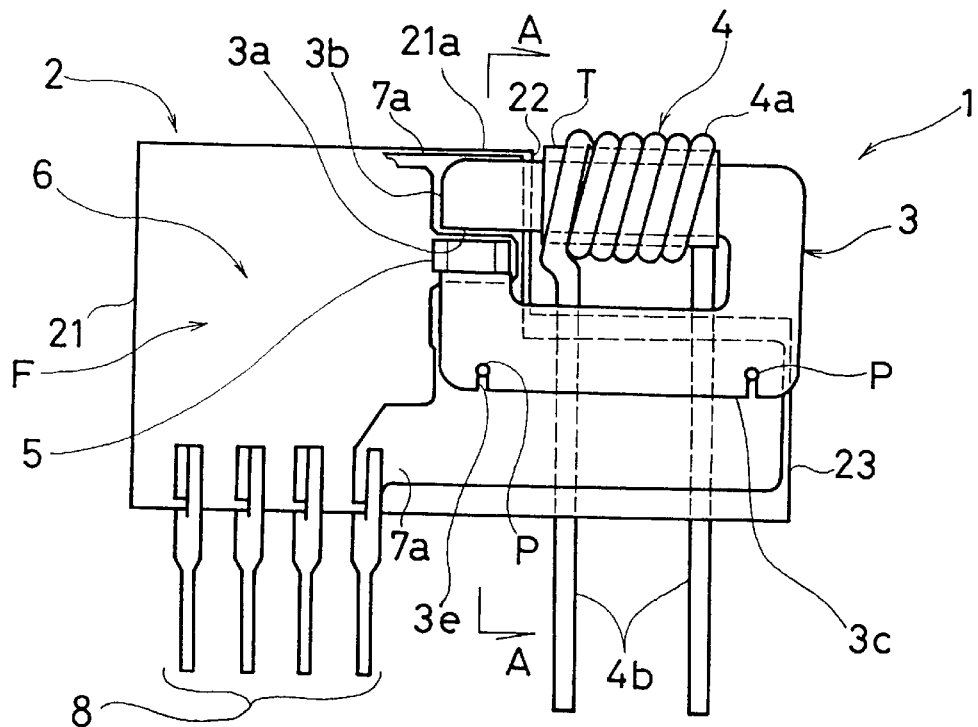
Figure 2:
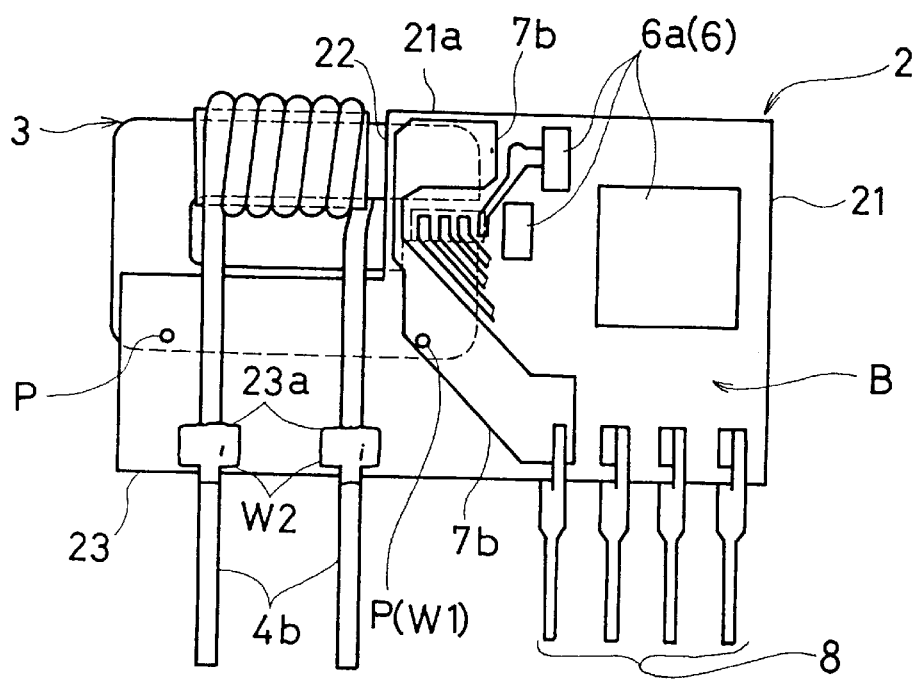
FIG. 2 is a side view of the same sensor seen from the side opposite to that of FIG. 1.

The current sensor shown in FIGS. 1 and 2 comprises a magnetic circuit 3 having an air-gap 3$a$ and bearing a winding 4 in which flows the current to be measured. A magnetic field detector element 5 is arranged inside the air-gap 3$a$, this element being mounted on a support plate 2 which further comprises an electric circuit 6 not shown in detail on these figures, this circuit being designed in particular for amplifying the output signal of the magnetic field detector element 5. The conductor forming the winding 4 has two end portions 4$b$ which extend beyond an edge of the support plate 2 and make it possible to connect this winding to an external circuit, for example by soldering onto a printed circuit board. The electric circuit 6 has connecting terminals 8 which also extend beyond the edge of the support plate 2 so that they can be connected to an external circuit in a similar way as the conductor ends 4$b$.

Figure 4:
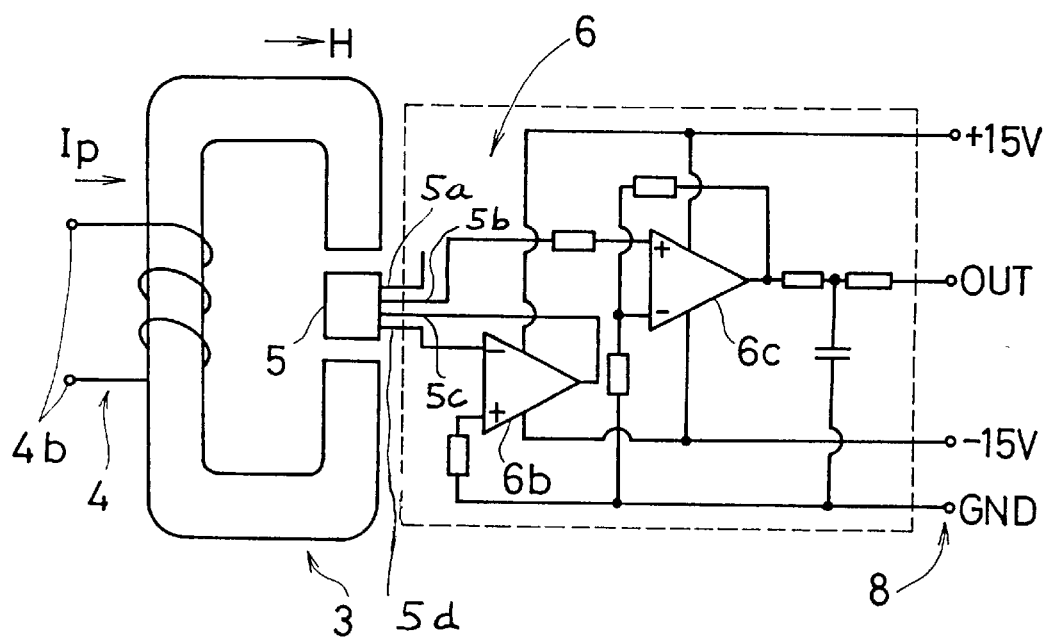
FIG. 4 is a simplified electric diagram of a current sensor according to the invention.

The diagram of FIG. 4 shows the operational principle of the present sensor, the current to be measured flowing in the winding 4 being denoted by $I_p$. This current generates a magnetic field H which is measured by the magnetic field detector element 5 connected to the electric circuit 6. The element 5 as represented in FIG. 4, for example a Hall cell, has four terminals, a first of which is connected to a constant, current delivering circuit of known type, not shown. At the terminal 5$b$ appears the output signal of the detector element, terminals 5$c$ and 5$d$ being connected to an operational amplifyer 6$b$ which maintains the potential of the terminal 5$d$ at zero, i.e. at the ground potential of the circuit (terminal GND). Terminal 5$b$ is connected to an amplifyer 6$c$ which delivers at the output terminal OUT a measuring signal representing the current in the winding 4. The two other outer terminals 8 are power supply terminals +15 V et −15 V.

Figure 3:
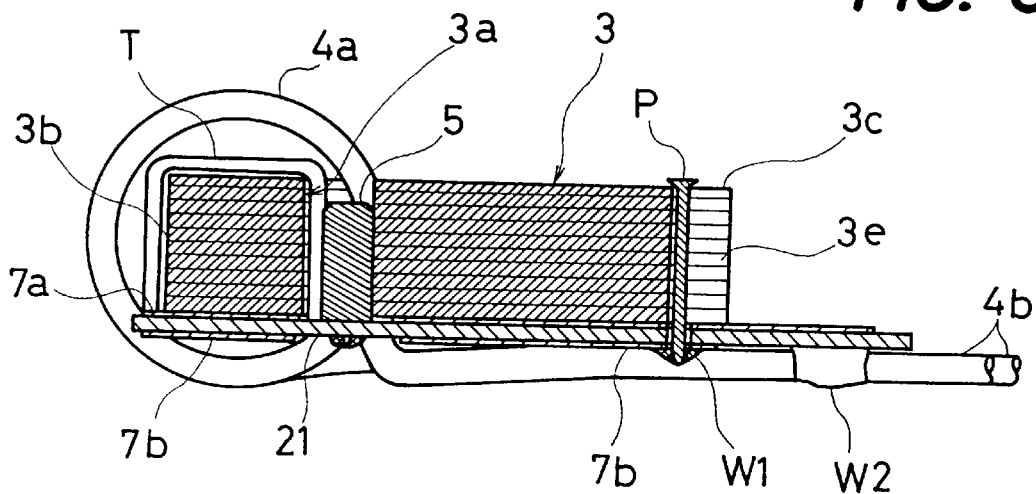
FIG. 3 is a sectional view along the line A—A of FIG. 1.

FIGS. 1 and 2 as well as FIG. 3 show the support plate 2 which comprises a main portion 21 as well as a lateral extension 23, the whole plate having, with respect to the general rectangular shape of the plate, a cut-away area 22. The turns 4$a$ of the winding 4 are placed in this cut-away area so that the thickness of the present sensor is determined by the transversal dimensions of this winding, which winding can be cylindrical, as shown in FIG. 3, or fit more closely around the magnetic circuit 3 according to the embodiment of FIG. 5 corresponding substantially to that of FIGS. 1 and 2.

The magnetic circuit 3 is preferably made in the form of a stack of magnetically permeable metal sheets and comprises a practically rectilinear leg on which are arranged an insulating tube T and the turns 4$a$ of the winding 4. The tube T is preferably made of a heat-shrinkable material so as to enclose the rectilinear leg of the circuit and thus maintain together the sheets at this place, in addition to its function of electrical insulation. The winding 4 is pre-formed before being mounted on the rectilinear leg of the magnetic circuit by passing it through the air-gap of this circuit.

The magnetic circuit 3 is fixed to the support plate 2 by means of pins P which are forced to pass in grooves 3e of the portion 3c of the circuit opposite to the rectilinear leg supporting the winding 4. These pins P have at one end an enlarged head and pass through the whole stack of sheets as well as through the support plate. At least one pin is connected by soldering, at W1, to a metallized portion 7b of one side of the support plate. On the opposite side of this plate on which lies a portion of the magnetic circuit 3, a metallized area 7a is in electric contact with the magnetic circuit 3.

The magnetic detector element 5 is arranged in the air-gap of magnetic circuit 3 and is connected to the electric circuit 6 on the side B of the plate opposite the side F on which the magnetic circuit 3 is fixed. The metallized areas 7a and 7b are connected to the output terminal 8 representing ground and form shielding areas on both sides of the support plate, in particular by extending between the winding 4 and the magnetic field detector element 5. A preferred form of these areas is shown in FIG. 1 and 2, the remainder of the printed circuit forming the circuit 6 being only partially shown. The reference number 6a denotes components of this circuit which are schematically represented. The conductors 4b are arranged so as to pass on the side B of the support plate and are fixed by solderings W2 to points 23a of the extension 23 of the support plate.

Figure 5:
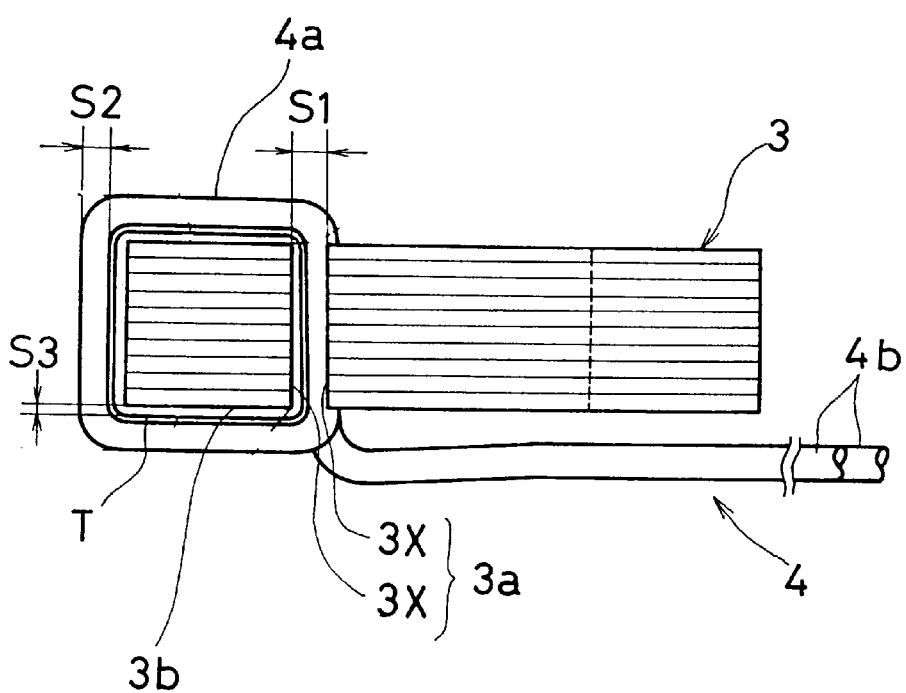
FIG. 5 is a front view of a magnetic circuit provided with a winding as it can be used in a current sensor according to FIG. 1.

FIG. 5 shows an embodiment of the winding 4 by which not only the outer thickness of the sensor can be reduced as compared to the embodiment of FIG. 3, but by which the length of the air-gap 3a (between 3X, 3X) can also be reduced while the mounting of the winding on the rectilinear leg by passing the same through the air-gap remains still possible. As a matter of fact, the rectangular section of the winding of FIG. 5 only requires an air-gap S1 slightly larger than the thickness S2 of the winding, as it is shown in FIG. 5 in which the thickness of the tube T is denoted S3.

It results from the above that the present sensor can be made in an extremely flat shape since its thickness is determined substantially by the thickness of the magnetic circuit and the winding in which flows the current to be measured. Furthermore, this sensor is distinguished by a weak interference between the circuit of the current to be measurd and the magnetic field detector element with its amplifyer circuit, as well as by a good immunity against stray fields produced by the environment of the sensor, which immunity is due in particular to the presence of said metallized areas forming an effective shielding on both sides of the support plate. Finally, the present sensor can be manufactured economically and efficiently, in particular due to the fact that the winding can be pre-formed and installed simply by a translatory movement through the air-gap, to the fact that the magnetic circuit can thus be made as a single part of an appropriate material, for example of ferrite, or by metal sheets of same shape, and to the fact that this circuit is fixed very simply on one side of the support plate of the sensor and the solderings can be made on only one side of this support plate. The flat shape of the sensor makes it possible, in particular, to mount the same on an external circuit plate in a way achieving a minimum bulk whether the sensor is mounted in a perpendicular position or, by bending the connecting conductors at a right angle, in a position parallel to such an external plate.

We claim:

1. Current sensor comprising a magnetic circuit with an air-gap, a winding arranged on this magnetic circuit in which flows the electric current to be measured, a magnetic field detector arranged in said air-gap, and a support plate bearing an electric circuit arranged for amplifying an output signal of said magnetic field detector, characterized in that said support plate comprises a main portion and a lateral extension of the same, such that the plate has a cutaway area defined by adjacent sides of, respectively, said main portion and said extension, the magnetic field detector being mounted on the support plate and the magnetic circuit being fixed to this plate in such a way that the magnetic field detector is placed in the air-gap of the magnetic circuit and the winding is placed, at least partially, in said cut-away area.

2. Sensor according to claim 1, characterized in that the support plate comprises at least one metallized shielding area which is connected to the ground of the electric circuit, this area having at least one portion extending between the magnetic field detector and said winding.

3. Sensor according to claim 2, characterized in that said shielding area has a portion extending between the support plate and a part of the magnetic circuit.

4. Sensor according to claim 3, characterized in that each side of the support plate comprises at least one such metallized shielding area.

5. Sensor according to claim 1, characterized in that the winding is placed on a substantially rectilinear leg of the magnetic circuit, the air-gap being formed between a lateral surface portion of a free end of this rectilinear leg and a free end of a leg of the magnetic circuit which is perpendicular to said rectilinear leg.

6. Sensor according to claim 5, characterized in that the thickness of the winding in the transversal direction thereof is smaller than the length of the air-gap of the magnetic circuit.

7. Sensor according to claim 5, characterized in that an electrically insulating tube is arranged inside the winding around the rectilinear leg of the magnetic circuit bearing said winding.

8. Sensor according to claim 7, characterized in that the magnetic circuit is made in the form of a stack of metal sheets, the insulating tube is arranged so as to maintain together the portions of the various sheets forming the leg on which it is placed, and a portion of the magnetic circuit is fixed mechanically to the support plate so as to maintain together the sheets of the circuit by means of this fixing.

9. Sensor according to claim 7, characterized in that the insulating tube is made of a heat-shrinkable material.

10. Sensor according to claim 5, characterized in that the winding has a cross-section such that this winding closely fits around the leg of the magnetic circuit on which it is arranged, possibly over an electrically insulating tube.

11. Sensor according to claim 8, characterized in that the insulating tube is made of a heat-shrinkable material.

* * * * *